United States Patent [19]

McGinn

[11] Patent Number: 4,870,303
[45] Date of Patent: Sep. 26, 1989

[54] PHASE DETECTOR

[75] Inventor: Michael McGinn, Scottsdale, Ariz.

[73] Assignee: Motorola, Inc., Schaumburg, Ill.

[21] Appl. No.: 201,974

[22] Filed: Jun. 3, 1988

[51] Int. Cl.[4] .......................... G05F 5/00; H03K 5/13
[52] U.S. Cl. .................................... 307/511; 328/133;
  328/155; 328/160; 307/262
[58] Field of Search ................. 328/160, 133, 155, 55,
  328/109; 329/50; 307/498, 510, 511, 262

[56] References Cited

U.S. PATENT DOCUMENTS

| | | | |
|---|---|---|---|
| 3,838,262 | 9/1974 | van de Plassche | 307/498 |
| 4,156,204 | 5/1979 | Hargis | 331/12 |
| 4,242,634 | 12/1980 | Metcalf | 307/498 |
| 4,629,914 | 12/1986 | Okanobu | 328/133 |
| 4,773,085 | 9/1988 | Cordell | 307/523 |

Primary Examiner—Stanley D. Miller
Assistant Examiner—Richard Roseen
Attorney, Agent, or Firm—Michael D. Bingham

[57] ABSTRACT

A detection circuit for providing an error signal corresponding to the phase difference between applied input signals is described comprising a balanced multiplier input section for receiving the input signals and having a pair of outputs; a first switching circuit responsive to a switching signal for commutating the outputs of the multiplier section between first and second circuit nodes; a current turnaround circuit coupled between the first and second circuit nodes and third and fourth circuit nodes, a second switching circuit responsive to the switching signal for alternately coupling the third and fourth circuit nodes to a fifth circuit node and an output of the detection circuit; a current mirror circuit having first and second terminals and a third switching circuit responsive to the switching signal for alternately coupling the first and second terminals of the current mirror circuit to the fifth circuit node and the output of the detection circuit.

4 Claims, 2 Drawing Sheets

4,870,303

PHASE DETECTOR

BACKGROUND OF THE INVENTION

The present invention relates to balanced phase detector circuits and, more particularly, to a low offset commutating phase detector suited for use in a phase locked loop.

Phase detectors are well known in the art. Typically, such phase detectors are comprised of a balanced analog multiplier input section, a current turn-around circuit coupled to the outputs of the multiplier section and a differential-to-single ended converter circuit for supplying a single output signal in response to a pair of input signals being applied to respective inputs of the multiplier section. The phase detector generates the well known S-shaped transfer function as the phase of the two input signals are varied with respect to one another with the output of the detector being zero whenever the two input signals are in phase quadrature.

When fabricated in monolithic integrated circuit form, prior art phase detectors, as discussed above, produce phase errors which can not be tolerated in precision phase lock loops. These phase errors are generated in the current turn-around and current mirror or differential-to-single ended converter circuitry due to mismatch between transistors and resistors comprising these circuits.

Hence, a need exists for an improved phase detector circuit having very low offset to eliminate such phase errors.

SUMMARY OF THE INVENTION

Accordingly, it is an object of the present invention to provide an improved phase detector.

It is another object of the present invention to provide an improved integrated phase detector circuit.

In accordance with the above and other objects there is provided a phase detector circuit comprising a balanced multiplier input section for receiving a pair of differential input signals and having a pair of outputs, a first switching circuit responsive to a switching signal for commutating the outputs of the multiplier section between first and second circuit nodes, a current turn-around circuit coupled between the first and second circuit nodes and third and fourth circuit nodes, a second switching circuit responsive to the switching signal for alternately coupling the third and fourth circuit nodes to a fifth circuit node and an output of the phase detector, a current mirror circuit having first and second terminals and a third switching circuit responsive to the switching signal for alternately coupling said first and second terminals of said current mirror circuit to the fifth circuit node and the output of the phase detector.

DETAILED DESCRIPTION OF THE INVENTION

Figure 1:
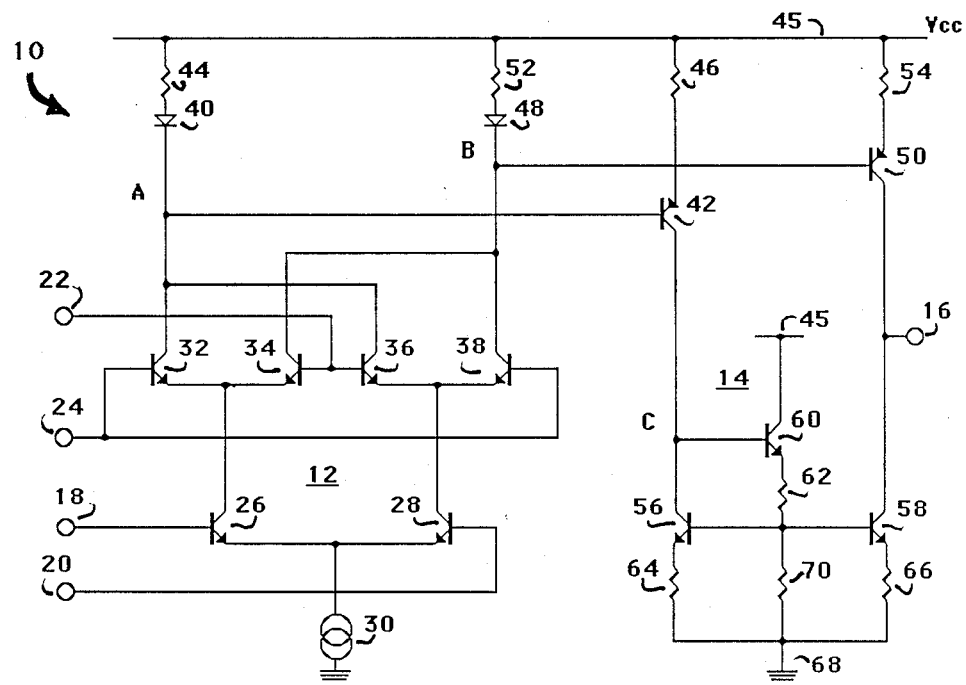
FIG. 1 is a schematic diagram illustrating a prior art phase detector circuit.

Turning now to FIG. 1, there is shown prior art phase detector circuit 10 which is typically manufactured in monolithic integrated circuit form. Phase detector 10 includes balanced input multiplier section 12, a current turn-around section and differential-to-single ended (current mirror) circuit 14 between which output 16 is coupled. A pair of input signals are applied respectively to inputs 18, 20 and 22, 24. Multiplier section 12 is comprised of a three differential transistor pairs including transistors 26, 28; 32, 34 and 36, 38 and a current supply 30 coupled to the emitters of differential transistor pair 26 and 28.

The operation of multiplier section 12 is well known and is described in an article entitled "Applications of a Monolithic Analog Multiplier" published in the IEEE JOURNAL OF SOLID STATE CIRCUITS, DECEMBER 1968. Briefly, multiplier section 12 has a S-shaped transfer function whereby differential output currents are produced at circuit nodes A and B whenever the relative phases of the two input signals applied to the multiplier are other than in quadrature relationship. However, the output of multiplier 12 is zero when the two signals are in phase quadrature.

The current at node A is established via diode 40 and resistor 44 which are series connected between power supply conductor 45 and node A and is turned around or mirrored at node C through transistor 42 and resistor 46 as the base of the transistor is coupled to node A. Similarly, the differential current established at node B flows through the series connected diode 48 and resistor 52 and is, in turn, mirrored and flows through transistor 50 and resistor 54. Current mirror circuit 14 converts the differential currents flowing from the collectors of transistors 42 and 50 to a single ended output signal at output 16.

Current mirror circuit 14 comprises matched transistors 56 and 58 the bases of which are interconnected to the emitter of transistor 60 via resistor 62. The base of transistor 60 is coupled to the collector of transistor 56 at node C while the collector of the former is connected to node 45. The emitters of transistors 56 and 58 are coupled to node 68 via respective resistors 64 and 66 while their bases are returned to node 68 via resistor 70. The operation of current mirror 14 is well known in that the current flowing through the collector-emitter conduction path of transistor 56 forces a equal current to be sank by transistor 58. Hence, an error signal equal to the difference between the current sourced to output 16 minus the current sank by transistor 58 is produced whenever the differential output currents from multiplier section 12 are different. This error signal is equal to ±2ΔI, where ΔI is the differential phase error signal established at the output of the multiplier, provided that the mark to space ratio of the two applied input signals are essentially equal.

Phase detector 10, which is typically included in a phase lock loop, ideally provides a S-shaped output signal with zero crossing whenever the two applied input signals are in phase quadrature. However, due to tolerances and process mismatch between the resistors and transistors of the two current mirrors, DC phase errors appear at the output of the detector which generates phase errors within the phase lock loop which is highly undesirable.

Figure 2:
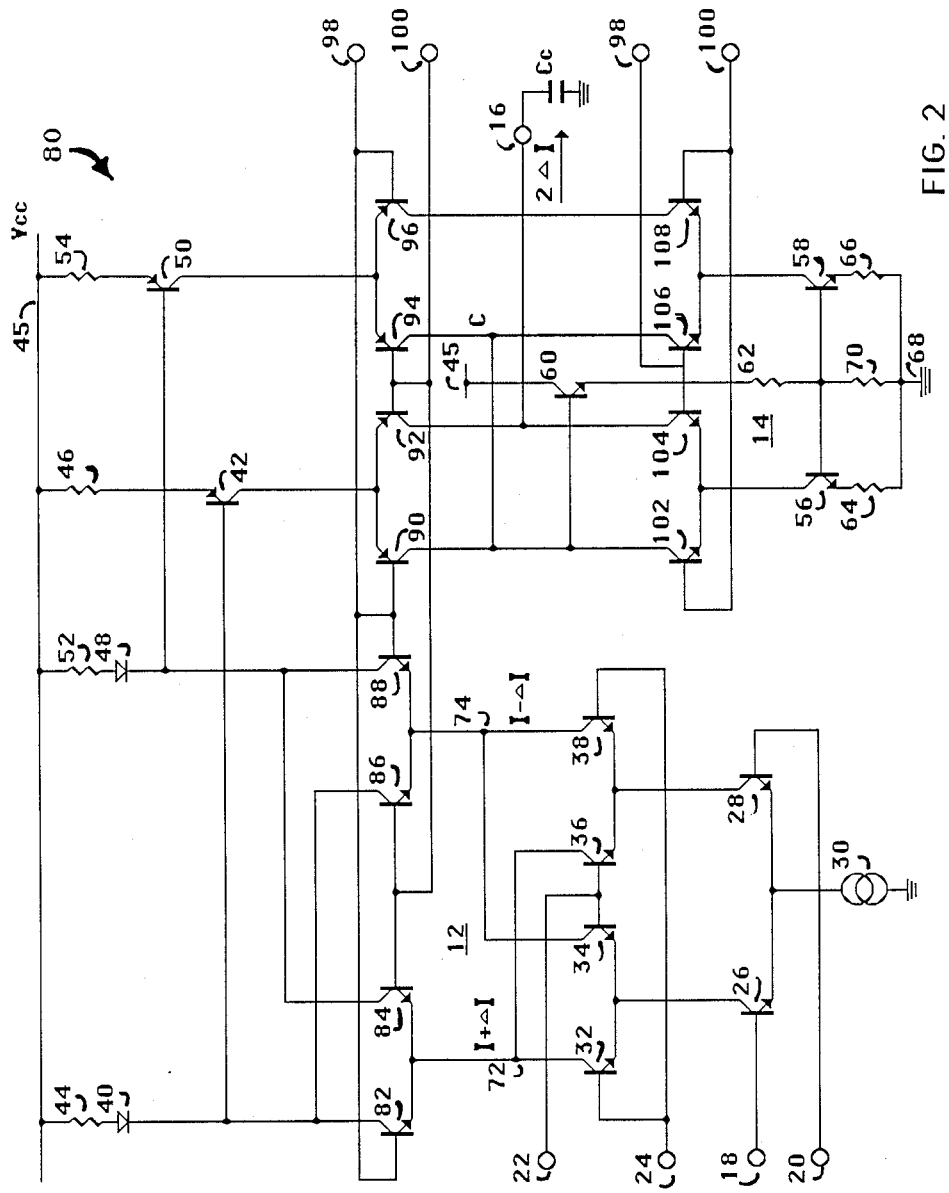
FIG. 2 is a schematic diagram of the phase detector of the preferred embodiment.
Figure 2:
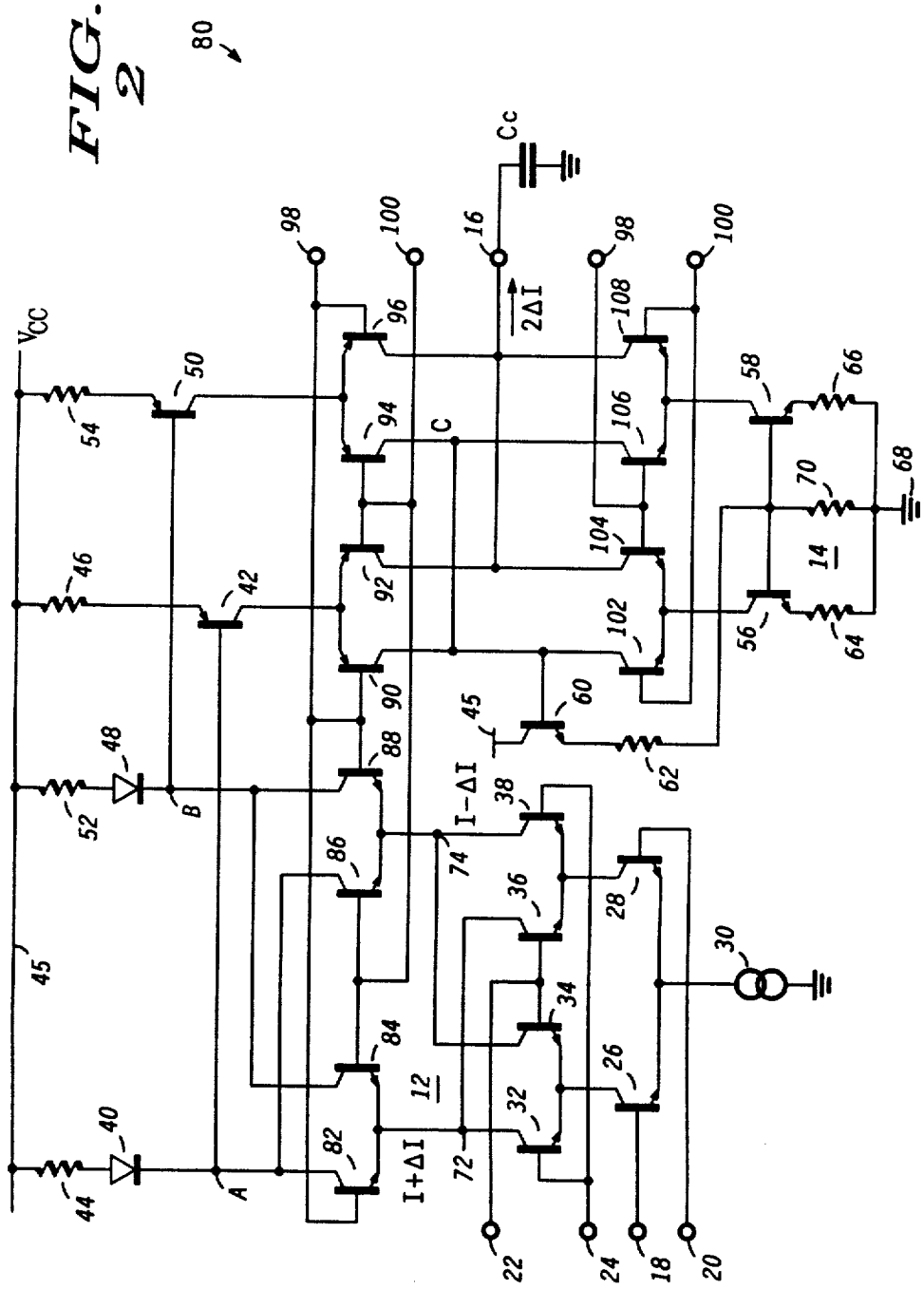

Referring now to FIG. 2 there is illustrated phase detector 80 for eliminating phase shift errors associated with offsets and inaccuracies in the top turn-around circuit and current mirror 14. These offsets and inaccuracies as previously mentioned arise due to process tolerances and mismatch of the components in the top and lower current mirrors. It is understood that components of phase detector 80 corresponding to like components of phase detector 10 of FIG. 1 are designated by the same reference numbers.

Briefly, the improvement is accomplished by utilizing three switching circuits responsive to a switching signal to remove the offsets and inaccuracies. Each switching circuit comprises two sets of differential transistors pairs for causing the offsets to alternatively go positive and negative thereby effectively cancelling the offsets as will be described in more detail later.

A first switching circuit includes differential transistor pairs 82, 84 and 86, 88 coupled respectively between the outputs of multiplier section 12 and the upper current mirror at nodes A and B. Hence, the emitters of transistors 82 and 84 are coupled to the first differential output 72 of multiplier section 12 while the emitters of transistors 86 and 88 are coupled to the second differential output 74 of the multiplier section. The collectors of transistors 82 and 86 are coupled to node A while the collectors of transistors 84 and 88 are coupled to node B. The bases of transistors 82 and 88 are coupled to switching terminal 98 while the bases of transistors 84 and 86 are coupled to switching terminal 100. A differential switching signal is applied to terminals 98 and 100 to alternately cause transistors 82, 88 and 84, 86 to be rendered conductive and non-conductive respectively hence, the differential switching signal behaves as a square wave. Similarly, a second switching circuit comprising differential pair of transistors 90, 92 and 94, 96 is coupled between the outputs of the current turn-around or upper current mirror (the collectors of transistors 42 and 50) and node C and output 16 while a third switching circuit is coupled between lower current mirror 14 and node C and output 16. The third switching circuit includes differential transistor pairs 102, 104 and 106, 108. Each of the second and third switching circuits are also responsive to the switching signals applied at inputs 98 and 100.

Assuming first that terminal 98 is positive with respect to terminal 100, transistors 82, 88, 92, 94, 104 and 106 are turned on while the other transistors of the three switching circuits are turned off. In this mode terminal 72 is electrically coupled to node A while terminal 74 is coupled to node B. Thus, the DC current I and any phase error signal $+\Delta I$ (due to the two input signals at the inputs of multiplier section 12 being other than in phase quadrature) flows through resistor 44 and diode means 40 and is mirrored through transistor 42 to appear at the emitters of transistors 90 and 92. Similarly the DC current I and differential phase error signal $-\Delta I$ flows through resistor 52 and diode means 48 and is mirrored through transistor 50 and appears at the emitters of transistors 94 and 96. The phase error signal $I+\Delta I$ flows through transistor 92 directly to output 16 while the phase error signal $I-\Delta I$ flows through transistor 94 and transistor 106 to the first current leg of bottom current mirror 14 including transistor 58 and resistor 66. This current is then mirrored through transistor 56 of the second current leg of current mirror 14 and is forced to flow through transistor 104 where the current is sank from output 16. Hence, the total phase error signal is source to output 16 equal to a value of twice the differential phase error signal, i.e., $2\Delta I$. Similarly, as the polarity of the switching signal is reversed, transistors 84, 86, 90, 96, 102 and 108 are rendered conductive while their opposite respective pairs are turned off. In this second mode of operation outputs 72 and 74 of multiplier section 12 are electrically switched to nodes B and A respectively. The phase error signal $I+\Delta I$ is therefore mirrored through transistor 50 and flows through transistor 96 to output 16. Simultaneously, the differential phase error signal $I-\Delta I$ is mirrored through transistor 42. This current then flows through transistor 102 and the second current leg of current mirror 14 comprising transistor 56 and resistor 64 where it is mirrored by transistor 58. The mirrored current is therefore sank from output 16 via transistor 108 and subtracted from the error signal $I+\Delta I$. Again the total phase error signal source to output 16 is equal to $2\Delta I$. This error signal is filtered by capacitor Cc to provide a single polarity DC error signal corresponding to phase difference of the input signals applied at the respective pair of inputs to multiplier section 12. Potential overlap of the differential phase errors of adjacent data is undesirable and may be avoided by making the frequency of the differential switching signal greater than the maximum instantaneous frequency of the input signals.

Any offsets or inaccuracies in phase detector 80, arising because of process tolerances in the components of the turn-around circuit are removed by the second switch since theses offsets alternately go positive and negative due to switching and after filtering by capacitor Cc cancel out. Similarly, the third switch removes any mismatch arising in bottom current mirror 14 by interchanging the first and second current legs thereof on alternate half cycles of the switching signal as described above. Again, any offset errors associated with current mirror 14 are cancelled by capacitor Cc.

Hence, what has been described above is a novel phase detector comprising three switching circuits in combination with a balanced multiplier section and an upper and lower current mirror for providing phase error detection between a pair of applied input signals to the multiplier section.

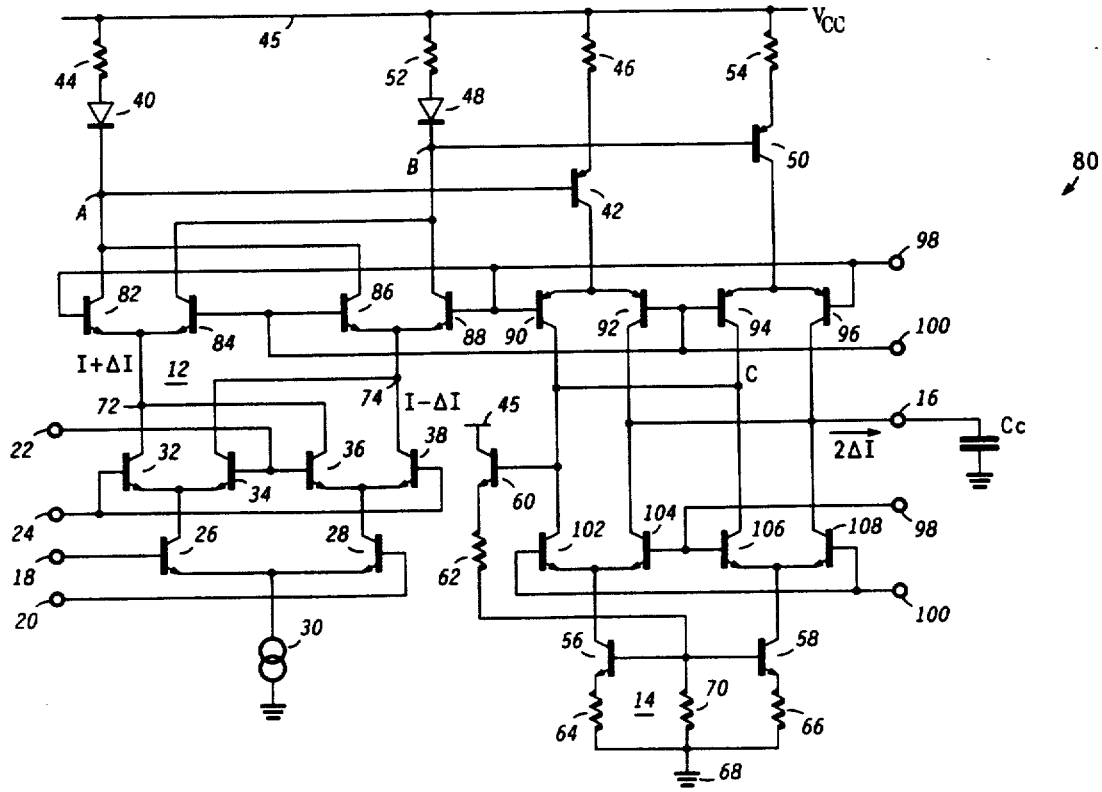

I claim:
1. A phase detector, comprising:
   a balanced multiplier section having inputs and a pair of outputs;
   first switching circuit means responsive to a switching signal for alternately coupling said pair of outputs of said multiplier section between first and second circuit nodes respectively;
   a current turn-around circuit coupled between said first and second current nodes and third and fourth circuit nodes;
   second switching circuit means responsive to said switching signal for alternately coupling said third and fourth circuit nodes between fifth and sixth circuit nodes respectively;
   a current mirror having first and second current conduction paths;
   third switching circuit means responsive to said switching signal for alternately coupling said first and second current conduction paths between said sixth and fifth circuit nodes respectively; and
   circuit means for coupling said fifth circuit node to an output of the phase detector.
2. The phase detector of claim 1 wherein said first switching circuit means includes:
   first and second transistors each having a base, an emitter and a collector, said emitters being coupled to a first one of said pair of outputs of said multiplier section, said base of said first transistor being coupled to a first terminal and said base of said second transistor being coupled to a second termi- nal, said switching signal being applied across said first and second terminals;

third and fourth transistors each having a base, an emitter and a collector, said emitters being coupled to a second one of said pair of outputs of said multiplier section, said collector of said third transistor being coupled with said collector of said first transistor to said first circuit node, said collector of said fourth transistor being coupled with said collector of said second transistor to said second circuit node, said bases of said third and fourth transistors being coupled respectively to said second and said first terminals; and said switching signal being supplied across said first and said second terminals.

3. The phase detector of claim 2 wherein said second switching circuit means includes;

fifth and sixth transistors each having a base, an emitter and a collector, said emitters being coupled to said third circuit node, said base of said fifth transistor being coupled to said first terminal and said base of said sixth transistor being coupled to said second terminal; and seventh and eighth transistors each having a base, an emitter and a collector, said emitters being coupled to said fourth circuit node, said collector of said seventh transistor being coupled with said collector of said fifth transistor to said sixth circuit node, said collector of said eighth transistor being coupled with said collector of said sixth transistor to said fifth circuit node, said bases of said seventh and eighth transistors being coupled respectively to said second and said first terminals.

4. The phase detector of claim 3 wherein said third switching circuit means includes:

ninth and tenth transistors each having a base, an emitter and a collector, said emitters being coupled to said second current conduction path of said current mirror, said base of said ninth transistor being coupled to said second terminal and said base of said tenth transistor being coupled to said first terminal; and eleventh and twelfth transistors each having a base, an emitter and a collector, said emitters being coupled to said first current conduction path of said current mirror, said collector of said eleventh transistor being coupled with said collector of said ninth transistor to said sixth circuit node, said collector of said twelfth transistor being coupled with said collector of said tenth transistor to said fifth circuit node, said bases of said eleventh and twelfth transistors being coupled respectively to said first and said second terminals.

* * * * *

UNITED STATES PATENT AND TRADEMARK OFFICE
CERTIFICATE OF CORRECTION

PATENT NO. : 4,870,303                                Page 1 of 3
DATED       : September 26, 1989
INVENTOR(S) : Michael McGinn It is certified that error appears in the above-indentified patent and that said Letters Patent is hereby corrected as shown below:

The title page should be deleted to appear as shown on the attached page.

The drawing sheet consisting of Fig. 2, should be deleted to be replaced with the drawing sheet consisting of Fig. 2, as shown on the attached page.

Signed and Sealed this

Eighteenth Day of January, 1994

Attest:

BRUCE LEHMAN

Attesting Officer          Commissioner of Patents and Trademarks

United States Patent [19]

McGinn

[11] Patent Number: 4,870,303
[45] Date of Patent: Sep. 26, 1989

[54] PHASE DETECTOR

[75] Inventor: Michael McGinn, Scottsdale, Ariz.

[73] Assignee: Motorola, Inc., Schaumburg, Ill.

[21] Appl. No.: 201,974

[22] Filed: Jun. 3, 1988

[51] Int. Cl.⁴ ............................. G05F 5/00; H03K 5/13
[52] U.S. Cl. .................................. 307/511; 328/133; 328/155; 328/160; 307/262
[58] Field of Search .................. 328/160, 133, 155, 55, 328/109; 329/50; 307/498, 510, 511, 262

[56] References Cited

U.S. PATENT DOCUMENTS

| | | | |
|---|---|---|---|
| 3,838,262 | 9/1974 | van de Plassche | 307/498 |
| 4,156,204 | 5/1979 | Hargis | 331/12 |
| 4,242,634 | 12/1980 | Metcalf | 307/498 |
| 4,629,914 | 12/1986 | Okanobu | 328/133 |
| 4,773,085 | 9/1988 | Cordell | 307/523 |

*Primary Examiner*—Stanley D. Miller
*Assistant Examiner*—Richard Roseen
*Attorney, Agent, or Firm*—Michael D. Bingham

[57] ABSTRACT

A detection circuit for providing an error signal corresponding to the phase difference between applied input signals is described comprising a balanced multiplier input section for receiving the input signals and having a pair of outputs; a first switching circuit responsive to a switching signal for commutating the outputs of the multiplier section between first and second circuit nodes; a current turnaround circuit coupled between the first and second circuit nodes and third and fourth circuit nodes, a second switching circuit responsive to the switching signal for alternately coupling the third and fourth circuit nodes to a fifth circuit node and an output of the detection circuit; a current mirror circuit having first and second terminals and a third switching circuit responsive to the switching signal for alternately coupling the first and second terminals of the current mirror circuit to the fifth circuit node and the output of the detection circuit.

4 Claims, 2 Drawing Sheets